(12) United States Patent
Green

(10) Patent No.: US 6,507,050 B1
(45) Date of Patent: Jan. 14, 2003

(54) THYRISTORS HAVING A NOVEL ARRANGEMENT OF CONCENTRIC PERIMETER ZONES

(75) Inventor: Peter W. Green, Hazel Grove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 38 days.

(21) Appl. No.: 09/639,146

(22) Filed: Aug. 16, 2000

(30) Foreign Application Priority Data

Aug. 21, 1999 (GB) .............................. 9919764

(51) Int. Cl.$^7$ ...................... H01L 29/74; H01L 31/111; H01L 23/58
(52) U.S. Cl. ...................... 257/170; 257/127; 257/495
(58) Field of Search ............................... 257/119, 127, 257/170, 168, 171, 169, 490, 494, 495

(56) References Cited

U.S. PATENT DOCUMENTS 4,040,878 A    8/1977   Rowe ......................... 148/188

FOREIGN PATENT DOCUMENTS

EP            0519268 B1    12/1992  ................. 257/170

*Primary Examiner*—Steven Loke
(74) *Attorney, Agent, or Firm*—Steven R. Biren

(57) ABSTRACT

The forward and reverse blocking voltage capability of a thyristor in accordance with the invention is substantially independent of the active thyristor area (Aa), thereby facilitating its design and its manufacture. This is achieved by means of a concentric arrangement of a deep inner lower-doped perimeter zone (42) of the forward base region (2) with a deep outer perimeter zone (43) of the same conductivity type, doping profile and depth (A4$xj$=A$xj$). The outer perimeter zone (43) brings the reverse blocking p-n junction (34) to the front surface (11) at a lateral distance (D3) around the forward blocking p-n junction (32). The outer perimeter zone (43) extends in depth to a lower perimeter zone (44) of the underlying region (4) that forms the reverse blocking junction with the high-resistivity base region (3) of opposite conductivity type. All these perimeter zones (42–44) together provide the thyristor with a deep peripheral termination which surrounds the active thyristor area (Aa). By making the inner and outer perimeter zones (42, 43) much deeper than the surrounded forward base region (2), the forward and reverse blocking voltage capability of the thyristor is determined substantially independently of the doping of the forward base region (2) and layout geometry of the N–P–N–P or N–P–N–P–N region structure in the active thyristor area (Aa). This doping and layout geometry can be chosen to give different magnitudes of transistor gain and different thyristor switching characteristics, all within the same peripheral termination. Current conduction in the lower-doped perimeter zone (42) is less than in the highly-doped, highly-conductive base perimeter of prior-art planar thyristors and may even be pinched off from the active area (Aa), so easing the layout design of emitter-base shorts (1$a$) in the active area (Aa).

8 Claims, 4 Drawing Sheets

THYRISTORS HAVING A NOVEL ARRANGEMENT OF CONCENTRIC PERIMETER ZONES

BACKGROUND OF THE INVENTION

This invention relates to thyristors and to methods of manufacturing thyristors. The thyristor may have a bi-directional conducting capability as well as a bi-directional blocking capability (i.e. it may be a triac), or it may merely have a uni-directional conducting capability and a bi-directional blocking capability.

Thyristors are well-known bipolar semiconductor devices, comprising a semiconductor body having an N–P–N–P region structure between opposite, first and second major surfaces. The N–P–N–P region structure includes a forward base region of a first conductivity type (e.g. p-type) that forms a forward blocking p–n junction with a higher-resistivity base region of the opposite second conductivity type. The base region of the second conductivity type is herein termed the "reverse" base region. It is mainly in this high-resistivity region that high voltage is carried across a depletion layer in both the forward and reverse blocking states of the thyristor. The reverse base region separates the forward blocking junction from a reverse blocking junction formed with an underlying region of the first conductivity type. In the forward blocking state, the voltage-carrying depletion layer extends in the high-resistivity reverse base region from the forward blocking junction. In the reverse blocking state, the voltage-carrying depletion layer extends in the high-resistivity reverse base region from the reverse blocking junction.

European patent specification EP-B-0 519 268 describes a bipolar N–P–N planar transistor having a p-type base region that forms a reverse-biased p–n junction with a higher-resistivity collector region. The transistor is designed for high temperature operation (i.e. above 200° C.). For this reason, a lower-doped p-type perimeter zone is provided to form the perimeter of the base region and terminates the p–n junction at a first major surface. The perimeter zone extends from the first major surface to a greater depth in the collector region than the base region. The perimeter zone acts as a guard ring that reduces the surface peak field at the outer perimeter of the base region so as to provide leakage current stability at temperatures above 200° C. It is stated in col.5 line 10 that the invention of EP-B-0 519 268 can also be used for thyristors and diodes. The whole contents of EP-B-0 519 268 are hereby incorporated herein as reference material.

The following further statements are made in col.2 line 54 to col.3 line 16 of EP-B-0 519 268:

that the resulting thermal stability at temperatures above 200° C. is achieved independent of any surface charges present in any glass passivation layer;

that the magnitude of reverse voltage that can be blocked by the p–n junction is dependent on the dimensioning and doping of the base region and of its perimeter zone;

that a further increase in the thermally stable reverse voltage can be achieved when an even deeper, mesa trench adjoins directly the perimeter zone and surrounds the latter in annular form. FIG. 2 of EP-B-0 519 268 illustrates an N–P–N transistor with such a mesa trench, whereas FIGS. 3 and 4 of EP-B-0 519 268 illustrate N–P–N transistors without mesa trenches.

SUMMARY OF THE INVENTION

It is an aim of the present invention to provide a thyristor having a blocking voltage capability that is substantially independent of the layout geometry of the active thyristor area, and thereby to facilitate its design and its manufacture.

According to a first aspect of the present invention, a thyristor having a forward base region with a lower-doped perimeter zone is characterised by a concentric arrangement of the perimeter zone of the forward blocking p–n junction with an outer perimeter zone of the same first conductivity type that brings the reverse blocking p–n junction of the thyristor to the first major surface at a lateral distance around the forward blocking p–n junction. The outer perimeter zone has a doping profile and a depth that are the same as a doping profile and the depth of the lower-doped perimeter zone of the forward base region. The outer perimeter zone extends in depth to a lower perimeter zone of the underlying region of the first conductivity type which forms the reverse blocking junction with the other base region (reverse base region) that is of the opposite (second) conductivity type.

All these perimeter zones together provide the thyristor with a deep peripheral termination which surrounds an active thyristor area that conducts in an on-state of the thyristor. The low-doped inner and outer perimeter zones are much deeper than the surrounded forward base region, typically at least 35 μm deeper and/or at least twice the depth of the forward base region. By making these perimeter zones so much deeper, the forward and reverse the blocking voltage capability of the thyristor is determined substantially independently of the layout geometry of the active thyristor area.

Whereas the low-doped perimeter zone of EP-B-0 519 268 was adopted to provide high temperature devices (above 200° C.), the concentric perimeter zone arrangement of the present invention is adopted to effectively de-couple the design of the active thyristor area from the determination of the blocking voltage capability. Thus, most thyristors with perimeter zones in accordance with the present invention may be designed for operation at more normal temperatures, e.g. in a range from about 125° C. to 150° C. Furthermore, the inner and outer perimeter zones can terminate at a plane surface area of the top major surface, at a passivating layer thereon, without needing to provide any deeper mesa trench inbetween.

The doping of the forward base region and layout geometry of the N–P–N–P region structure in the active thyristor area can be chosen to give different magnitudes of transistor gain and different thyristor switching characteristics, while maintaining a given blocking voltage capability by means of the concentric perimeter zone arrangement of the peripheral terminations of the forward and reverse blocking p–n junctions. Furthermore, most thyristors comprise emitter-base shorts in the active area, which result in a pattern of current paths in the base region. It is necessary to lay out the pattern of emitter-base shorts of prior-art planar thyristors in such a way that these current paths are not adversely influenced by the highly doped (and hence highly conductive) perimeter of the base region. Current conduction in the lower doped perimeter zone of thyristors in accordance with the present invention is less and may even be pinched off from the active area, so easing the design of emitter-base shorts in the active area.

With a given peripheral termination, thyristors of the same type but a wide range of differing on-characteristics may be formed by varying the active thyristor area. Alternatively, different active thyristor areas may be incorporated to give different thyristor types having a given blocking voltage capability as determined by their concentric perimeter zone arrangement.

Most types of thyristor comprise a gate electrode coupled to the forward base region. Different types of gated thyristor may be designed with a concentric perimeter zone arrangement terminating their forward and reverse blocking p–n junctions in accordance with the present invention. The gate electrode may ohmically contact the forward base region in a simple thyristor or in an amplifying-gate thyristor. It may be capacitively coupled to the forward base region via a dielectric layer in, for example, a MOS-gated thyristor. Generally the gate electrode serves to turn on the thyristor from a blocking state. When the thyristor has an ohmic gate electrode, it may be additionally designed to also turn off the thyristor by diverting current from the base region into the gate circuit.

However, instead of having a gate electrode, the thyristor may be of the optically-triggered type. In this case, incident light (from, for example, a light-guide or light-emitting diode or laser in the thyristor device package) turns on the thyristor by generating electron-hole pairs in the base region. An optically-triggered thyristor may be designed with a concentric perimeter zone arrangement terminating its forward and reverse blocking p–n junctions in accordance with the present invention. The thyristor may be a triac, and so it may have a bi-directional conducting capability as well as a bi-directional blocking capability. Such a device is effectively a monolithic integration of two thyristors in an anti-parallel configuration. In this case, the underlying region of the first conductivity type acts as an emitter region of the forward-conduction thyristor and as a base region of the reverse-conducting thyristor. As explained below, the edge termination scheme in accordance with the present invention may be additionally arranged to have the top emitter region extended into the low-doped perimeter zone of the forward base region, so as to overcome a problem present in prior-art planar triacs. However, the thyristor may merely have a uni-directional conducting capability and a bi-directional blocking capability. In this case, the underlying region of the first conductivity type acts only as an emitter.

The lateral distance (i.e. spacing) between the forward and reverse blocking p–n junctions is determined by their concentric perimeter zones. Preferably, this lateral distance/spacing is no smaller than (and is preferably larger than) the smallest vertical thickness of the high-resistivity base region between the forward and reverse blocking p–n junctions in the active thyristor area. This spacing arrangement is advantageous in avoiding pre-mature breakdown that might otherwise result from reach-through of the depletion layer between the forward and reverse blocking p–n junctions at the first major surface. It is preferable for breakdown to occur in the bulk of the device body, rather than at the surface. It is also preferable for the vertical thickness of the high-resistivity base region to be sufficiently large to avoid punch-through of the depletion layer at the maximum applied voltage. Thus, when excessive voltages are present, it is generally preferable for an avalanche breakdown of the blocking p–n junction to take place before punch-through of the depletion layer can occur.

The outer perimeter zone comprises a same doping profile as the perimeter zone of the forward base region. It also has the same depth as the perimeter zone of the forward base region. These perimeter zones can be easily provided in the same doping step or steps. Their mutual spacing can be determined with good reproducibility by the spacing of windows in a masking pattern. The perimeter zones may also comprise additional shallower doping profiles.

According to another aspect of the present invention, there are provided advantageous methods of manufacturing thyristors with a concentric perimeter zone arrangement terminating their forward and reverse blocking p–n junctions in accordance with the invention.

In one such advantageous method, with a semiconductor body of silicon, the concentric arrangement of the inner perimeter zone (of the forward base region) and the outer perimeter zone may be formed by steps that include the implantation and diffusion of aluminium ions at the first major surface of the body. The lower perimeter zone may have a doping profile formed by diffusion from a metal aluminium pattern at the second major surface of the silicon body. The resulting lower perimeter zone may extend through more than half the thickness of the body. Windows in a masking pattern at the first and second major surfaces can be used to localise these doping processes. The diffusion of all these perimeter zones may be carried out in one or more common heating steps.

In order to optimise doping profiles and/or junction curvatures, the perimeter zones of a thyristor in accordance with the invention may comprise a shallow portion having a different dopant from a deep portion. Thus, for example, the shallow portion may be doped with boron and the deep portion may be doped with aluminium. For the perimeter zone of the forward base region it is usually preferable that both the shallow and deep portions are more lowly doped than the forward base region. Furthermore in this case, the shallow portion may extend laterally beyond the deep portion to extend the termination of the forward blocking p–n junction at the first major surface.

BRIEF DESCRIPTION OF THE DRAWING

These and other advantageous features in accordance with the present invention are illustrated in specific embodiments of the invention that are now described, by way of example, with reference to the accompanying diagrammatic drawings. In these drawings.

DESCRIPTION OF THE PREFERRED EMBODIMENTS

Figure 1:
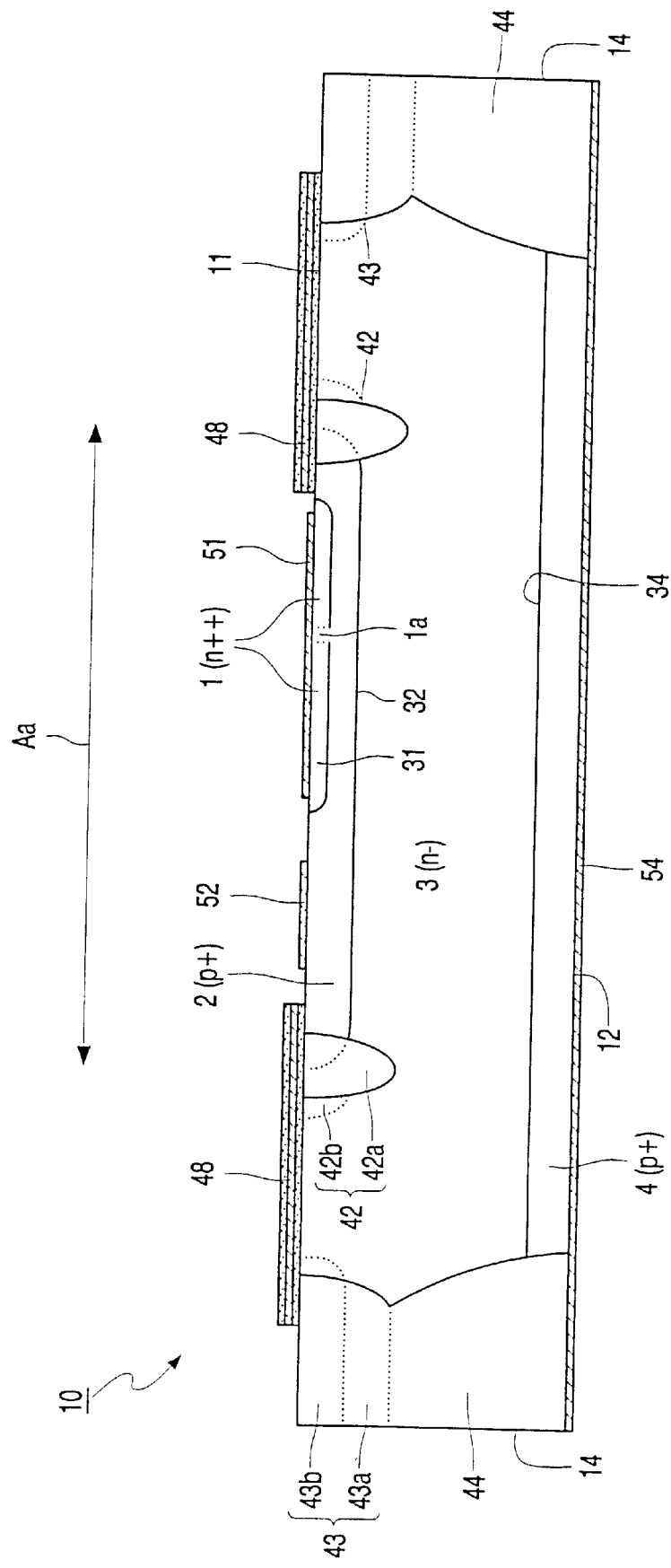
FIG. 1 is a cross-sectional view of an embodiment of a simple thyristor in accordance with the invention.
Figure 2:
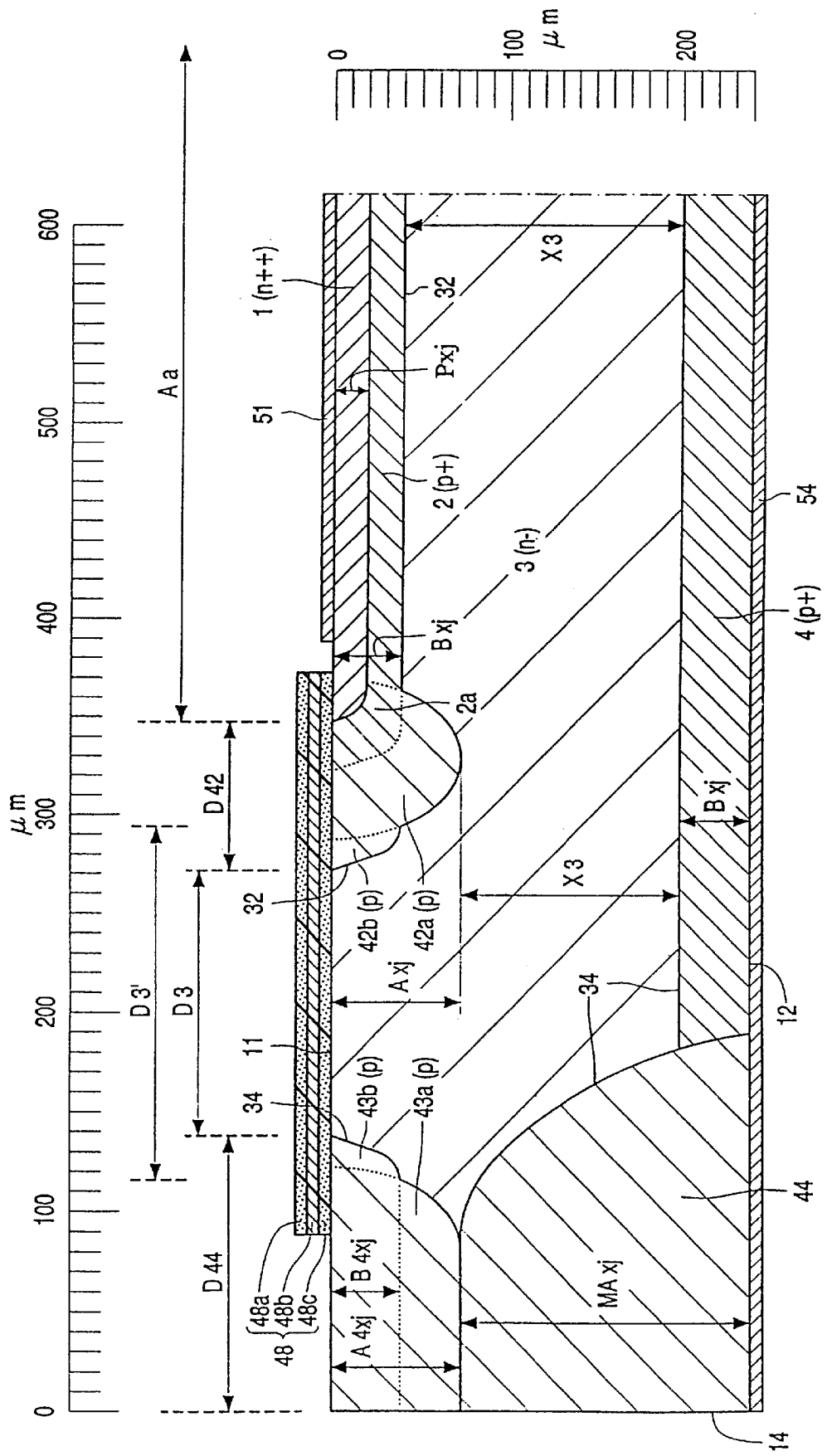
FIG. 2 is an enlarged cross-sectional view of a peripheral termination part of the thyristor of FIG. 1 or the triac of FIG. 3.
Figure 3:
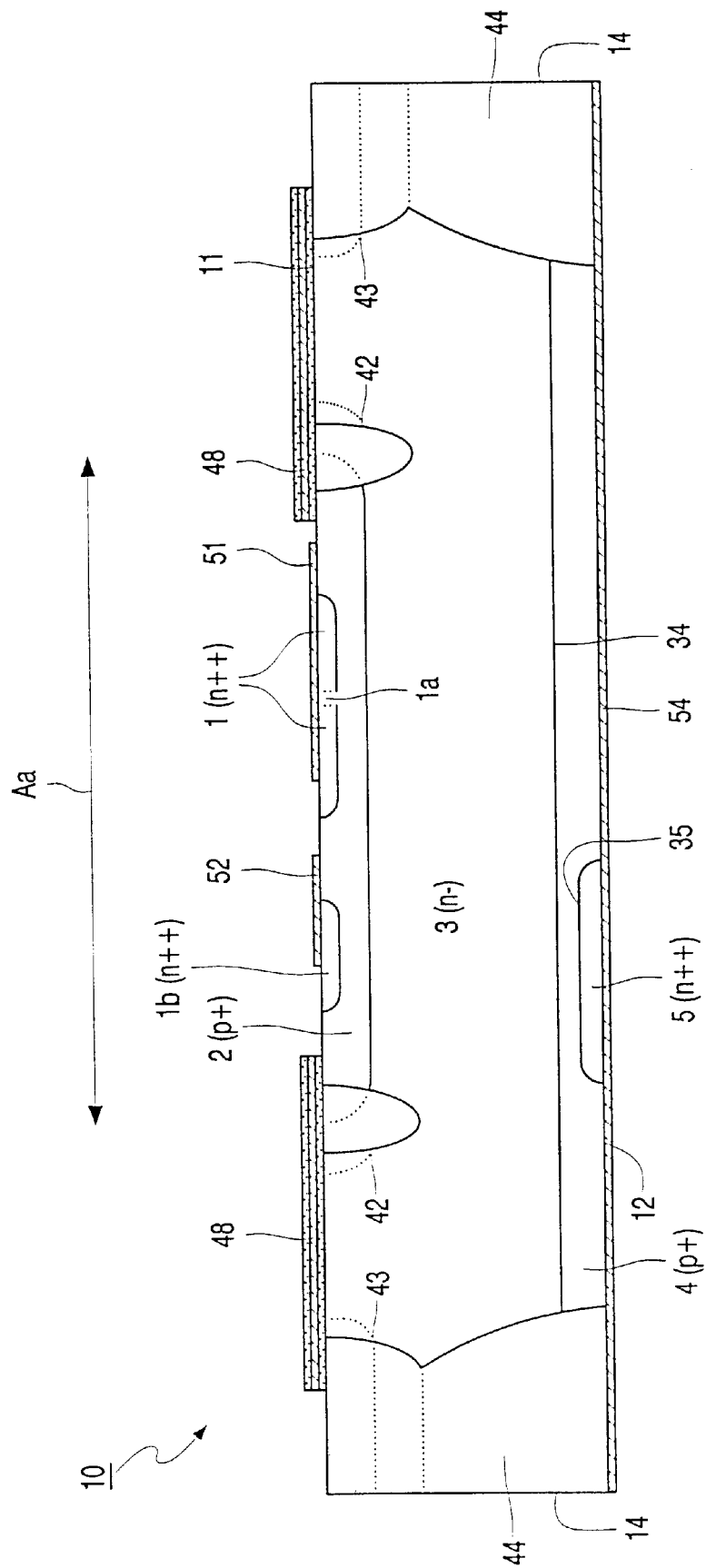
FIG. 3 is a cross-sectional view of an embodiment of a triac in accordance with the invention.
Figure 4:
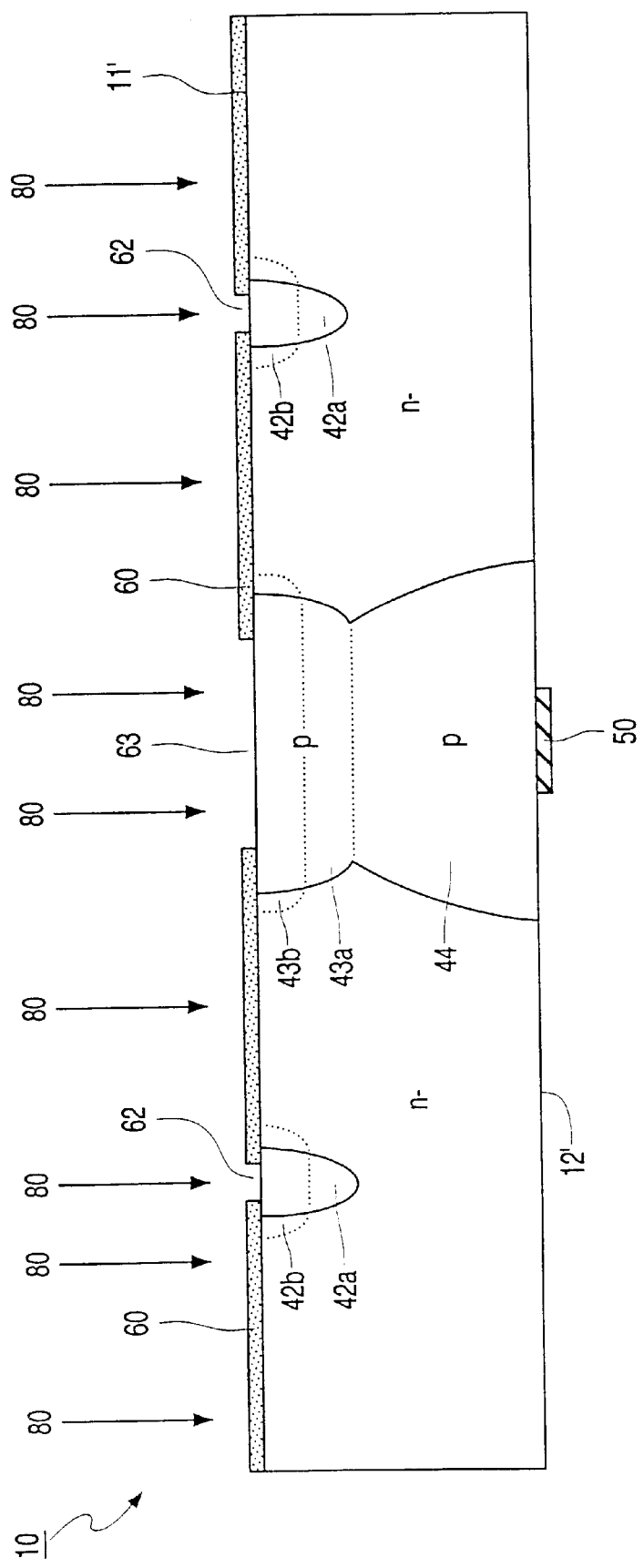
FIG. 4 is a cross-sectional view of adjacent peripheral termination parts of two thyristors, such as those of FIG. 1 or 3, at a stage during their manufacture by an embodiment of a method also in accordance with the present invention.

It should be noted that all the Figures are diagrammatic, even though micron scales are included in FIG. 2 to provide an indication of widths and depths in a specific example. In FIGS. 1, 3 and 4, relative dimensions and proportions of parts of the drawings have been shown exaggerated or reduced in size, for the sake of clarity and convenience in the drawings. The same reference signs are generally used to refer to corresponding or similar features in modified and different embodiments.

Each of the thyristor embodiments illustrated in FIGS. 1, 2 and 3 comprises a semiconductor body 10 having an N–P–N–P region structure 1 to 4 between its opposite major surfaces. The N–P–N–P region structure 1 to 4 includes two base regions 2 and 3 of opposite conductivity types, which are herein respectively termed "forward" and "reverse" base regions. The forward base region 2 of a first conductivity type (p-type in this embodiment) forms a forward blocking p–n junction 32 with the other base region 3. The reverse base region 3 of the second conductivity type forms a reverse blocking junction 34 with an underlying region 4 of the first conductivity type (p-type). Base region 3 is of higher resistivity than base region 2 and separates the forward and reverse blocking junctions 32 and 34. It is mainly in this higher-resistivity region 3 that high voltage is carried across a depletion layer in both the forward and reverse blocking states of the thyristor. In the forward blocking state, this depletion layer extends in the region 3 from the forward blocking junction 32. In the reverse blocking state, the voltage-carrying depletion layer extends in the region 3 from the reverse blocking junction 34.

In each thyristor embodiment, the N–P–N–P region structure 1 to 4 also includes an emitter region 1 (cathode) of the opposite conductivity type (n-type), which forms an emitter p–n junction 31 with the base region 2. The region 1 is contacted at the front major surface 11 of the body 10 by one main current-carrying electrode 51 (cathode electrode) of the thyristor. Typically the emitter region 1 has a distribution of perforations 1a therein at which the base region 2 extends to the surface 11. The emitter region 1 is shorted to the base region 2 by the electrode 51 at these perforations 1a.

FIGS. 1 and 3 illustrate a gated thyristor type, in which a gate electrode 52 is in ohmic contact with the base region 2 at the surface 11. In the triac of FIG. 3, the gate electrode 52 is also in ohmic contact with an additional local region 1b of the first conductivity type (n-type). FIGS. 1 and 3 illustrate non-symmetric layout geometries, in which the gate 52 is located in a corner of the active device layout at the body surface 11. The perimeter zone 42 (and the body periphery 14) may be of, for example, a basically square outline. The gate 52 is located in only one of the four corners of the active area Aa. The present invention may also be incorporated in thyristors with symmetric layout geometries, for example with the gate 52 located centrally in the device layout at the body surface 11.

The region 4 in FIG. 1 is the opposite emitter (anode) of the simple thyristor and is contacted at the back surface 12 of the body 10 by the second main current-carrying electrode 54 (anode electrode) of the thyristor. The region 4 in the triac of FIG. 3 acts as an emitter in one conduction direction (first quadrant) and as a base in the other conduction direction (third quadrant). A further emitter region 5 of the opposite conductivity type (n-type) is present in the region 4 of the triac and forms an emitter p–n junction 35 with the region 4 for triac operation in the third quadrant. Both the regions 4 and 5 of the triac are contacted at the surface 12 by the second main current-carrying electrode 54. In each of the devices of FIGS. 1 and 3, the region 4 may have a similar doping to the base region 2 and may be formed in the same doping stage at the surface 12 as used for the region 2 at the surface 11. More highly doped surface zones may be present in the regions 2 and 4 of the triac where the electrodes 51 and 54 contact the emitter-portions of these regions 2 and 4 in the anti-parallel thyristor configuration.

To the extent that they have been described so far, the N–P–N–P region structure 1 to 4 and N–P–N–P–N region structure 1 to 5 are conventional structures for thyristors and triacs. However, as will now be described, the thyristors of FIGS. 1 to 3 have a novel and advantageous peripheral termination for the forward and reverse blocking p–n junctions 32 and 34. This termination comprises a concentric arrangement of low-doped perimeter zones 42 and 43.

The inner zone 42 of the concentric arrangement forms a low-doped perimeter of the forward base region 2 and terminates the forward blocking p–n junction 32 at the first major surface 11. This inner perimeter zone 42 extends from the first major surface 11 over a much greater depth Axj in the high resistivity region 3 than the forward base region 2 of depth Bxj, for example about 40 μm (or more) deeper than Bxj. The outer perimeter zone 43 of the concentric arrangement brings the reverse blocking p–n junction 34 to the top major surface 11 at a lateral distance D3 around the forward blocking p–n junction 32. The zones 42 and 43 are each of an annular layout, the outline of which may be circular or square or rectangular or a combination of straight and curved sections, for example. The particular annular geometry chosen for a thyristor depends on the particular design that is preferred for that thyristor and its manufacture.

The perimeter zones 42 and 43 terminate the forward and reverse blocking p–n junctions 32 and 34 at a passivating layer 48 on the surface 11. The present invention permits the same passivating layer 48 to be used for both the forward and reverse blocking p–n junctions 32 and 34. The thyristors can be passivated without requiring any additional insulating layer. Thus, thyristors in accordance with the present invention can have a simple insulating layer pattern at the top surface I1. In the specific examples illustrated in FIGS. 1 to 3, the passivating layer 48 has a wide window over most of the active area Aa of the device, where the cathode and gate electrodes 51 and 52 contact the surface 11. The silicon surface areas between the window edge of the passivating layer 48 and the edges of the cathode and gate electrodes 51 and 52 may be unpassivated bare silicon, for example.

The outer perimeter zone 43 has a depth A4xj (determined by its portion 43a) that is the same as the depth Axj of the perimeter zone 42 of the forward base region 2. Furthermore, the outer perimeter zone 43 has a doping profile p(AI) in portion 43a that is of a low-doping concentration and the same as a doping profile p(AI) in portion 42a of the perimeter zone 42. It should be noted that the whole of the perimeter zone 42 is lower doped than the base region 2. In the drawing Figures, a doping notation with plus and minus signs is used so that, for example, p+ indicates that the region 2 has a higher doping concentration than the p perimeter zone 42. Similarly, n++ indicates that the conductivity-type determining doping concentration of the emitter region 1 is higher than the conductivity-type determining doping concentration p+ of the base region 2; whereas n− indicates that the conductivity-type determining doping concentration of the base region 3 is lower than the conductivity-type determining doping concentration p of the perimeter zones 42 and 43. In the forward blocking state of the thyristor, the depletion layer from the reverse-biased junction 32 with the base region 3 spreads further back into the p perimeter zone 42 and at least the p portion 43a of the outer perimeter zone 43 due to their doping concentration (p) being lower than that (p+) of the base region 2.

In the form illustrated by way of example in FIGS. 1 to 4, the perimeter zones 42 and 43 each comprises a deep doping profile p(AI) in portions 42a & 43a and a shallow doping profile p(B) in portions 42b & 43b. Both the deep and shallow portions 42a and 42b of the inner zone 42 are lower doped than the base region 2. FIGS. 1 to 4 show the shallow portion 42b extending laterally beyond the deep portion 42a so as to extend the termination of the forward blocking p–n junction 32 at the surface 11. In the forward blocking state, this shallow extension portion 42b can encourage the spreading of the field lines in the depletion layer at the surface 11, and so may enhance the high blocking voltage capability of the p–n junction 32. The outer perimeter zone 43 forms an internal angle (curving from less than 90°) with the surface 11, encouraging the spreading of the field lines in the depletion layer at the surface 11 in the reverse blocking state. This internal angle is conducive to achieving a high blocking voltage for the p–n junction 34, and so the doping concentration and lateral extent of its shallow portion 43b is less critical than those of the shallow portion 42b. As described below with reference to FIG. 4, the shallow doping profile p(B) in portion 43b may be either the same as or different to the shallow doping profile p(B) in portion 42b.

The outer perimeter zone 43 extends in depth to a lower perimeter zone 44 of the underlying region 4. The outer and lower perimeter zones 43 and 44 and the inner perimeter zone 42 together provide the thyristor with a peripheral termination 42-44 which surrounds an active thyristor area Aa that conducts in an on-state of the thyristor. The active area Aa comprises the regions 1 to 4 in the FIG. 1 thyristor and the regions 1 to 5 in the FIG. 3 triac. The depth (A4xj=Axj) of the outer and inner perimeter zones 43 and 42 are so much larger than the depth Bxj of the surrounded forward base region 2 as to determine the blocking voltage capability of the thyristor substantially independently of the layout geometry of the active thyristor area Aa.

The outer perimeter zone 43 merges with the lower perimeter zone 44 to form a continuous isolation region around the active thyristor area Aa. The peripheral termination 42 to 44 of the present invention may be used around an active thyristor area Aa in an integrated circuit. In this case, the perimeter zones of the thyristor may be spaced from the periphery 14 of the body 10, and the region 4 may be a buried layer in the body 10. However, FIGS. 1 to 4 illustrate what is likely to be a more common application of the invention in a discrete device, wherein the region 4 adjoins the second major surface 12 of the body 10. Furthermore, as indicated in FIGS. 1 to 3, the outer and lower perimeter zones 43 and 44 extend entirely around the periphery 14 of the body of FIGS. 1 to 4, as a peripheral isolation region.

A specific example will now be described with reference to FIG. 2, capable of blocking voltages of about 1 kV to 1.2 kV. The thyristor is designed for operation at ordinary dissipation temperatures (less than 200° C.), for example at about 125° C. in the on-state. The resistivity of the n– base region 3 is assumed to be, for example, in the range of 35 $\Omega.cm^{-1}$ to 45 $\Omega.cm^{-1}$, which corresponds to a phosphorus doping concentration of around $10^{14}$ $c^{-3}$. The p+ regions 2 and 4 are assumed to have a boron surface doping concentration in the range of, for example, $10^{18}$ $cm^{-3}$ to $10^{20}$ $cm^{-3}$. A phosphorus surface doping concentration in the range of, for example, $10^{20}$ $cm^{-3}$ to $10^{21}$ $cm^{-3}$. is assumed for the n++ emitter region(s) 1 and 5. The portions 42a and 43a of the perimeter zones 42 and 43 may have an aluminium peak shallow doping concentration of between $5\times10^{16}$ $cm^{-3}$ and $5\times10^{17}$ $cm^{-3}$. The shallow portion 42b of the inner perimeter zone 42 may have a boron surface doping concentration p of between $5\times10^{16}$ $cm^{-3}$ and $5\times10^{17}$ $cm^3$. The doping of the portion 43b of the outer perimeter zone 43 is not very critical. The portion 43b may have a boron doping concentration that corresponds either to the p+ of the base region 2 or to the p of the perimeter portion 42b, or it may contain both doping concentrations.

FIG. 2 shows the lower perimeter zone 44 extending from the bottom major surface 12 over a depth MAxj that is larger than the depth (A4xj=Axj) that the outer perimeter zone 43 extends from the top major surface 11. This relationship of the depths MAxj and A4xj may be adopted with a thick body 10 and/or with deep regions 2 and 4. In the specific example as illustrated, the body 10 is about 240 μm thick, and the regions 2 and 4 are each at most about 40 μm deep. The depth MAxj of the lower perimeter zone 44 is in the range of 180 μm to 150 μm, e.g. 160 μm. It is chosen to overlap slightly with the upper outer zone 43. The depth (A4xj=Axj) of the perimeter zones 42 and 43 is in the range of 65 μm to 85 μm, e.g. 75 μm. Preferably the inner and outer perimeter zones 42 and 43 are at least 35 μm (micrometers) deeper than the surrounded forward base region 2. Thus, the depth (A4xj=Axj) may be about twice the thickness Bxj of the active base region 2 in the typical example of FIG. 2, or it may be even larger. In addition to being deep enough to determine the blocking voltage capability independent of the active area Aa, the depth (A4xj=Axj) must be large enough to complete the peripheral isolation with the region 44. The maximum value of the depth (A4xj=Axj) in any given device structure is determined by the residual base width X3 of the high-resistivity base region 3, which needs to be no smaller than a minimum size for avoiding voltage punchthrough. The depth Bxj may be chosen over a wide range, depending on the desired thyristor characteristics. However, in each case, the depth (A4xj=Axj) of the perimeter zones is large enough to be able to support the blocked high voltage carried by the depletion layer with the high resistivity base region 3.

Also in FIG. 2, the forward and reverse blocking p–n junctions 32 and 34 are shown as laterally spaced at the surface 11 (as determined by their concentric perimeter zones 42 and 43) by a larger distance D3 than the smallest vertical thickness X3 of the high-resistivity base region 3 between the forward and reverse blocking p–n junctions 32 and 34 in the active thyristor area Aa. In the specific example, D3 may be in the range of about 130 μm to 140 μm, whereas the smallest X3 may be about 120 μm. In the example of FIG. 2, both the shallow portions 42b and 43b extend laterally beyond the deep portions 42a and 43a. Thus, the spacing D3' between the deep portions 42a and 43a is even larger than the smallest X3.

The forward and reverse blocking p–n junctions 32 and 34 terminate in the passivating layer 48 at the surface 11. This passivating layer may be a single layer of, for example, glass, or it may be a compound layer as illustrated in FIG. 2. It may comprise, for example, a semi-insulating polycrystalline silicon layer 48c at the surface 11. In the compound layer illustrated in FIG. 2, the layer 48a may comprise silicon dioxide on a layer 48b of silicon nitride on a layer 48c of oxygen-doped polycrystalline silicon. The respective thicknesses of the component layers 48a, 48b, 48c may be, for example, at least 1 μm, about 0.1 μm and about 0.5 μm.

The width D44 of the outer perimeter zone 43 is not very critical. The minimum value for D44 is dependent on the width required in manufacture for dividing a wafer 100 into the individual device bodies 10. When the wafer 100 is divided by sawing, the width of the lower perimeter region is preferably at least about 180 μm or more, whereas the minimum width of D44 may be about 140 μm. The width D42 of the inner perimeter zone 42 is very much less than the width of the active area Aa. FIG. 2 illustrates a width D42 in the range of about 50 μm to 70 μm. Thus, in the FIG. 2 example, the total edge termination width (D44+D3+D42) is about 330 μm to 370 μm. Other suitable dimensions in the FIG. 2 specific example are: a depth Pxj for the emitter region 1 of 15 μm to 20 μm; and a lateral diffusion of less than about 20 μm for the boron doping of the shallow perimeter portions 42b and 43b beyond the aluminium doping.

The concentric perimeter zone arrangement 42 to 44 of the present invention effectively de-couples the design of the active thyristor area Aa from the determination of the blocking voltage capability. Thus, the doping p+ of the regions 2 and 4 and the layout geometry of the N–P–N–P region structure 1 to 4 (or N–P–N–P–N region structure 1 to 5) in the active thyristor area Aa can be chosen to give different magnitudes of transistor gain (for regions 1–2–3 and/or 2–3–4 and/or 3–4–5) and different thyristor switching characteristics.

While adopting these different active area designs, a given blocking voltage capability can still be maintained by means of the concentric perimeter zone arrangement 42 to 44 which terminates the forward and reverse blocking p–n junctions 32 and 34. This is contrary to the previously known thyristor situation, in which the gain of the top (N–P–N) transistor 1–2–3 influences the blocking voltage. These blocking voltage characteristics can even be maintained with non-symmetric layout geometries, as illustrated in FIGS. 1 and 3. In these embodiments, the gate 52 is located in one corner of the active area Aa at the body surface 11, and hence is adjacent to a corner of the inner perimeter zone 42. Thus, the advantages of adopting a concentric perimeter zone arrangement 42 to 44 in accordance with the invention are not restricted to thyristors with symmetric layout geometries and a centrally-located gate 52.

Thus, the peripheral termination of FIG. 2 can be used with thyristors of the same type but with a wide range of differing on-characteristics, by varying the design of the active thyristor area Aa. Alternatively, different active thyristor areas Aa may be incorporated to give different thyristor types having a given blocking voltage capability as determined by the concentric perimeter zone arrangement of FIG. 2.

The invention is also beneficial in overcoming another problem that occurs in previously known planar triac structures. In previously known triacs in which both boron and aluminium are diffused to form the base region 2, the gain of the top transistor 1–2–3 is generally lower than the gain of the bottom transistor 3–4–5 in which only boron is diffused to form the base region 4. This leads to assymetry in gating, holding currents and dV/dt performance. Furthermore in one gating mode (sometimes termed the "1-gate mode") for the triac, the main conduction through the device (between the main electrodes 51 and 54) is achieved by current spreading from a so-called "gate thyristor" having the n++ region 1b and electrode 52 as its "cathode" and the p+ region 2 and electrode 51 as its "gate". This so-called "gate thyristor" needs to be triggered first. The gate sensitivity of the "gate thyristor" is influenced by resistive (i.e. partial shorting) paths in the p+ base region 2, between the electrodes 51 and 52. One such path in the case of a corner-gate planar triac is provided by the corner section of the base perimeter (42) beside the gate electrode 52. In prior-art planar triacs, this base perimeter is a highly doped p+ (and hence highly conductive) part of the forward base region. This highly conductive corner section of the base perimeter of prior-art triacs adversely affects the gate sensitivity of the triac and also extends the turned on section behind the gate electrode rather than spreading it to the main triac area. As a result, exceptionally high latching currents are needed for turn on in the 1-gate mode. In corner-gate triacs in accordance with the invention, the perimeter zone 42 is low doped (p), and hence is less conductive. Indeed current conduction in the lower doped perimeter zone 42 may even be pinched off from the active area Aa, by reducing the extent of the highly-doped perimeter portion 2a (see FIG. 2) that separates the low-doped perimeter zone 42 from the main emitter 1 (and/or from the gate emitter 1b of the FIG. 3 triac).

A more general benefit of the concentric perimeter zone arrangement 42 to 44 in accordance with the invention is that it determines the forward and reverse blocking voltage capability of a planar thyristor while avoiding the provision of a highly doped p+ (and hence highly conductive) perimeter to the base region. In prior art planar thyristors, the highly doped p+ (and hence highly conductive) perimeter of the forward base region provides a conductive path all the way around the perimeter of the active area Aa. This conductive perimeter path can have a shorting effect on current paths in the device, for example, on a pattern of current paths in the base region arising from a pattern of emitter-base shorts 1a in the active area Aa. Current conduction in the lower doped (p) perimeter zone 42 of thyristors in accordance with the invention is less and may even be pinched off from the active area Aa. FIG. 2 illustrates the n++ emitter region 1 being separated from the low-doped perimeter zone 42 by a p+ perimeter portion 2a that is part of the forward base region 2. Preferably the extent of this p+ perimeter portion 2a is kept to a minimum. Pinch-off of its conductive path can be achieved with a minimum extent of the highly-doped perimeter portion 2a. An extreme minimum case can be achieved by laterally extending the n++ emitter region 1 in FIG. 2 leftwards into the low-doped perimeter zone 42, in which case a slight increase rightwards in the width D42 of the zone 42 may also be desirable. Use of one or more of these aspects of the invention eases, for example, the design of emitter-base shorts 1a in the active area Aa. Thus, perimeter conduction around the forward base region 2, that is inherent in all planar designs, becomes less of a problem for future device design when using the concentric perimeter zone arrangement 42 to 44 in accordance with the present invention.

FIGS. 1 and 3 illustrate a simple gated thyristor and a gated triac. A more complex base and emitter layout 1,2 may be used in the active area Aa to provide, for example, an amplifying-gate thyristor. The gate electrode 52 of FIGS. 1 and 3 serves to turn on the thyristor from a blocking state, and the thyristor turns off when the magnitude of the current between its main electrodes 51 and 54 falls below the holding current. The active area Aa of a thyristor may be additionally designed with, for example, an interdigitated gate and cathode structure to permit turn off by diverting current from the base region 2 into the gate circuit. Furthermore, instead of an ohmic gate 52, the active area Aa may comprise, for example, a MOS-gated thyristor. Such a thyristor has a gate electrode 52 that is capacitively coupled to the forward base region 2 via an intermediate dielectric layer of, for example, silicon dioxide. All these different types of gated thyristor may be designed with a concentric perimeter zone arrangement 42 to 44 that terminates their forward and reverse blocking p–n junctions 32 and 34 in accordance with the present invention and so determines their voltage blocking capability. Furthermore, instead of having a gate electrode 52, the invention may be used for a thyristor of the optically-triggered type.

Thyristors in accordance with the invention can be manufactured in an advantageous manner. The starting material is an n-type monocrystalline silicon wafer 100 having a doping concentration n- for the high-resistivity base region 3 and having opposite major surfaces 11' and 12'. A plurality of the thyristors are fabricated side-by-side in the wafer 100, which is finally divided into the individual thyristor bodies 10.

In order to localise the dopings for the zones 42, 43 and 44, a masking pattern 60 of, for example, thick silicon dioxide is provided at the top major surface 11' of the wafer 100 and preferably also at the bottom surface 12', not shown in FIG. 4.

Dopant for the concentric inner and outer perimeter zones 42 and 43 is then provided by implantation of dopant ions 80 at spaced windows 62 and 63 in the masking pattern 60 at the surface 11'. This implanted dopant is diffused subsequently to the desired depth (A4$xj$=A$xj$).

A metal aluminium pattern 50 is formed at the surface 12' (at windows in the masking pattern) in a grid layout that corresponds to the lines along which the wafer is finally divided. The doping profile of the lower perimeter zone 44 is then formed by heating the wafer 100 to diffuse aluminium from the metal aluminium pattern 50. This aluminium diffusion process is similar to that described in U.S. Pat. 4,040,878 (our reference PHB32495), the whole contents of which are hereby incorporated herein as reference material. However, whereas U.S. Pat. No. 4,040,878 describes diffusing the aluminium across the whole thickness of the wafer, the aluminium diffusion here in a process in accordance with the present invention is at most over a total distance of MA$xj$ from the surface 12' so as to meet the zone 43 from the surface 11'.

In the same heating steps as for the metal aluminium pattern 50, the implanted dopant 80 may be diffused to form the concentric inner and outer perimeter zones 42 and 43 of depth A4$xj$ at the same time as the zone 44. These common heating steps for the zones 42 to 44 may include a boron diffusion step for forming the active base region 2, as well as a separate earlier heating step to diffuse partially the zones 42 to 44. Diffusion temperatures of typically about 1285° C. may be used.

Thus, the thermal diffusion of aluminium from the metal aluminium pattern 50 occurs at a much faster rate than that of the implanted dopant 80, so providing the lower perimeter zone 44 to a greater depth MA$xj$ than the depth A4$xj$ of the upper perimeter zone 43. The zones 43 and 44 are merged together to form a complete peripheral isolation region for the thyristor, as a result of their respective diffusions. The residue of the aluminium source 50 and the masking pattern 60 can be etched away from the surfaces 11' and 12', before providing the passivation and electrode layers of the final device structure.

Aluminium ions 80 are preferably used for the upper perimeter zones 42 and 43, in order to diffuse these zones 42 and 43 to a sufficient depth (A4$xj$=A$xj$) with the desired low dopant concentration (p).

Thus, the surface termination of the forward blocking p–n junction 32 is established at an isolation diffusion stage, using the aluminium implant diffusion to produce simultaneously:

the deep top isolation-region zone 43 that eventually brings the reverse blocking p–n junction to the top surface, and a local deep zone 42 (that eventually becomes the perimeter of a shallower, higher doped base region 2).

The forward blocking voltage is now dependent on the deep peripheral-isolation diffusion of implanted aluminium, whereas the gain of the top transistor 1–2–3 is dependent on the relationship of the separate normal boron and phosphorus dopings that are provided later for the regions 1 and 2. A wide variety of active thyristor areas Aa can be incorporated with this concentric perimeter zone arrangement 42 to 44 while maintaining its optimum blocking voltage, e.g. around 1 kV.

The present inventor has found that low-concentration aluminium implant diffusions of the depth (A4$xj$=A$xj$) required for the present invention can often lead to the formation of oxide donor states within the first 15 $\mu$m to 20 $\mu$m from the surface 11. These donor states can even form an n-type skin adjacent to the surface 11. This n-type skin can be overcome by implanting a low dose of boron ions.

Thus, boron ions 80 may also be implanted at the spaced windows 62 and 63 in the masking pattern 660, as illustrated in FIG. 4. They can be diffused simultaneously with the aluminium ions 80. The diffused boron implant increases the p-type doping concentration of the inner and outer perimeter zones 42 and 43 adjacent to the first major surface 11', where the n-type skin could otherwise be formed. This boron doping concentration may be in the range of, for example, $5\times10^{16}$ cm$^{-3}$ to $5\times10^{17}$ cm$^{-3}$ with a diffused depth B4$xj$ of, for example, about 30 $\mu$m to 40 $\mu$m. This low boron doping concentration is used for the upper portion 42b of the inner perimeter zone 42. It may also be used for the upper portion 43b of the outer perimeter zone 43. However the boron doping concentration of the upper portion 43b of the outer perimeter zone 43 may be higher, for example in the range of $10^{18}$ cm$^{-3}$ to $10^{20}$ cm$^{-3}$. As the outer perimeter zone in FIGS. 1 to 3 is present at the exposed periphery of the body 10, a high doping concentration for the portion 43b may be advantageous in countering any periphery degradation and/or contamination. Thus, the boron doping concentration of the upper portion 43b of the outer perimeter zone 43 may be increased (or may even be provided) in the doping stage used to provide the boron-doped base region 2. In this case, at least part of the window 63 is kept open when forming the base region 2.

As illustrated in FIG. 4, the boron increased p-type doping concentration (zones 42b, 43b) may be diffused laterally beyond the aluminium doping (zones 42a, 43a) of the inner and outer perimeter zones 42 and 43 at the surface 11'. When the higher boron doping p+(B) of the base region 2 is provided also in the upper portion 43b of the outer perimeter zone, this higher doping may provide the inner edge of the outer perimeter zone 43. In this case the facing edges of the perimeter zones 42 and 43 (and their spacing at the surface 11) would not be defined in the same doping process step. It is preferable to define the facing edges of the perimeter zones 42 by laterally-extending shallow portions 42b and 43b formed in the same doping process step, i.e. using the lower doping profile p(B) of portion 42b. In this case, the higher boron doping p+(B) of the base region 2 may be incorporated also in the upper portion 43b of the outer perimeter zone at a window whose edge is set back from the edge of the window 62.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A thyristor comprising a semiconductor body having an N–P–N–P region structure between opposite, first and second major surfaces, wherein the N–P–N–P region structure includes a forward base region of a first conductivity type forming a forward blocking p–n junction with a higher-resistivity reverse base region of the opposite second conductivity type, the reverse base region separates the forward blocking junction from a reverse blocking p–n junction formed with an underlying region of the first conductivity type, and a lower-doped perimeter zone of the first conductivity type forms the perimeter of the forward base region and terminates the forward blocking p–n junction at the first major surface and extends from the first major surface to a greater depth in the reverse base region than a depth in the forward base region, characterised by a concentric arrangement of the perimeter zone of the forward base region with an outer perimeter zone of the first conductivity type that brings the reverse blocking p–n junction of the thyristor to the first major surface at a lateral distance around the forward blocking p–n junction, the outer perimeter zone having a doping profile and a depth that are the same as a doping profile and the depth of the perimeter zone of the forward base region, the outer perimeter zone extending in depth to a lower perimeter zone of the underlying region of the first conductivity type, the outer and lower perimeter zones and the perimeter zone of the forward base region together providing the thyristor with a peripheral termination which surrounds an active thyristor area that conducts in an on-state of the thyristor, and the depth of the outer perimeter zone and of the perimeter zone of the forward base region being so much larger than the surrounded forward base region as to determine the reverse and forward blocking voltage capability of the thyristor substantially independently of the layout geometry of the active thyristor area.

2. A thyristor as claimed in claim 1, further characterised in that the lateral spacing between the forward and reverse blocking p–n junctions as determined by their concentric perimeter zones is no smaller than the vertical thickness of the reverse base region between the forward and reverse blocking p–n junctions in the active thyristor area.

3. A thyristor as claimed in claim 2, further characterised in that the forward and reverse blocking p–n junctions are laterally spaced by a larger distance than the vertical thickness of the reverse base region between the forward and reverse blocking p–n junctions in the active thyristor area.

4. A thyristor as claimed in claim 1, further characterised in that the perimeter zone of the forward base region comprises a shallow portion having a different dopant from a deep portion, both the shallow and deep portions are more lowly doped than the forward base region, and the shallow portion extends laterally beyond the deep portion to extend the termination of the forward blocking p–n junction at the first major surface 5. A thyristor as claimed in claim 1, further characterised in that the outer perimeter zone and the perimeter zone of the forward base region are at least 35 $\mu$m (micrometers) deeper than the surrounded forward base region.

6. A thyristor as claimed in claim 1, further characterised in that the underlying region of the first conductivity type adjoins the second major surface of the body, and the outer and lower perimeter zones of the first conductivity type extend entirely around the periphery of the body.

7. A thyristor as claimed in claim 1, further characterised in that the lower perimeter zone extends from the second major surface of the body over a depth that is larger than the depth that the outer perimeter zone extends from the first major surface.

8. A thyristor as claimed in claim 1, further characterised in that the forward and reverse blocking p–n junctions terminate in a passivating layer comprising a semi-insulating polycrystalline silicon layer at the first major surface.

* * * * *